(12) United States Patent
Nomura et al.

(10) Patent No.: US 12,177,982 B2
(45) Date of Patent: Dec. 24, 2024

(54) MODULE

(71) Applicant: Murata Manufacturing Co., Ltd., Nagaokakyo (JP)

(72) Inventors: Tadashi Nomura, Nagaokakyo (JP); Ryoichi Kita, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 217 days.

(21) Appl. No.: 18/062,048

(22) Filed: Dec. 6, 2022

(65) Prior Publication Data
US 2023/0100404 A1 Mar. 30, 2023

Related U.S. Application Data

(63) Continuation of application No. PCT/JP2021/020864, filed on Jun. 1, 2021.

(30) Foreign Application Priority Data

Jun. 11, 2020 (JP) .................. 2020-101570

(51) Int. Cl.
*H05K 1/18* (2006.01)
*H05K 9/00* (2006.01)

(52) U.S. Cl.
CPC ........... *H05K 1/181* (2013.01); *H05K 9/0084* (2013.01); *H05K 2201/10098* (2013.01); *H05K 2201/10371* (2013.01); *H05K 2201/10545* (2013.01); *H05K 2201/10795* (2013.01); *H05K 2201/10977* (2013.01)

(58) Field of Classification Search
CPC ...................................................... H05K 1/18
See application file for complete search history.

(56) References Cited

U.S. PATENT DOCUMENTS

| 5,689,878 A | 11/1997 | Dahringer et al. |
| 2005/0162841 A1* | 7/2005 | Ogatsu ................. H05K 9/0039 361/816 |
| 2018/0286796 A1* | 10/2018 | Kitazaki ........... H01L 23/49838 |

FOREIGN PATENT DOCUMENTS

| JP | H10-51173 A | 2/1998 |
| JP | 2000-223647 A | 8/2000 |
| JP | 2003-318592 A | 11/2003 |
| JP | 2018-170421 A | 11/2018 |

OTHER PUBLICATIONS

International Search Report for PCT/JP2021/020864 dated Jul. 27, 2021.

* cited by examiner

*Primary Examiner* — Jerry Wu
(74) *Attorney, Agent, or Firm* — Pearne & Gordon LLP

(57) ABSTRACT

A module includes: a substrate having a first surface; a first component mounted on the first surface; a first protruding electrode disposed on the first surface; a first resin film covering the first component along a shape of the first component, covering at least a part of the first surface, and partially covering the first protruding electrode; and a first shield film formed to overlap with the first resin film. The first protruding electrode includes a first sharpened portion, the first protruding electrode is exposed from the first resin film in at least a part of the first sharpened portion, and the first shield film is electrically connected to the first protruding electrode by covering a portion where the first protruding electrode is exposed from the first resin film.

15 Claims, 8 Drawing Sheets

MODULE

CROSS REFERENCE TO RELATED APPLICATION

This is a continuation of International Application No. PCT/JP2021/020864 filed on Jun. 1, 2021 which claims priority from Japanese Patent Application No. 2020-101570 filed on Jun. 11, 2020. The contents of these applications are incorporated herein by reference in their entireties.

BACKGROUND OF THE DISCLOSURE

Field of the Disclosure

The present disclosure relates to a module.

Description of the Related Art

A method of forming an electromagnetic shield is disclosed in Japanese Patent Laid-Open No. 2003-318592 (PTL 1). PTL 1 discloses a bag-shaped shield pack. This shield pack has a two-layer structure of: an insulating layer made of a thermosetting resin material; and a metal layer formed on the insulating layer. A printed circuit board on which electronic components are mounted is inserted into the shield pack, which is then vacuumed by suction to thereby bring the shield pack into close contact with the printed circuit board. At this time, the shield pack is broken and pierced through by a tip end of a ground connection terminal provided on the printed circuit board, and then, the ground connection terminal comes into contact with the metal layer to thereby form an electromagnetic shield.
PTL 1: Japanese Patent Laid-Open No. 2003-318592

BRIEF SUMMARY OF THE DISCLOSURE

According to the method of forming an electromagnetic shield disclosed in PTL 1, the fractured surface of the metal layer comes into contact with a bottom portion of the ground connection terminal to thereby establish electrical connection, and thus, the connection state becomes unstable, so that the shielding performance also becomes unstable.

Thus, it is a possible benefit of the present disclosure to provide a module capable of achieving stable shielding performance.

In order to achieve the above-mentioned possible benefit, a module according to the present disclosure includes: a substrate having a first surface; a first component mounted on the first surface; a first protruding electrode disposed on the first surface; a first resin film covering the first component along a shape of the first component, covering at least a part of the first surface, and partially covering the first protruding electrode; and a first shield film formed to overlap with the first resin film. The first protruding electrode includes a first sharpened portion. In at least a part of the first sharpened portion, the first protruding electrode is exposed from the first resin film. The first shield film is electrically connected to the first protruding electrode by covering a portion where the first protruding electrode is exposed from the first resin film.

According to the present disclosure, the first shield film covers a portion where the first sharpened portion is exposed from the first resin film, to thereby establish electrical connection between the first shield film and the first protruding electrode, so that stable shielding performance can be achieved.

DETAILED DESCRIPTION OF THE DISCLOSURE

The dimensional ratios shown in figures do not necessarily represent actual dimensions faithfully, and may be exaggerated for convenience of explanation. In the description below, when reference is made to the concepts "upward" or "downward" do not necessarily mean the absolute "upward" or "downward" direction, but may mean a relative "upward" or "downward" direction in a posture shown in each figure.

First Embodiment

Figure 1:
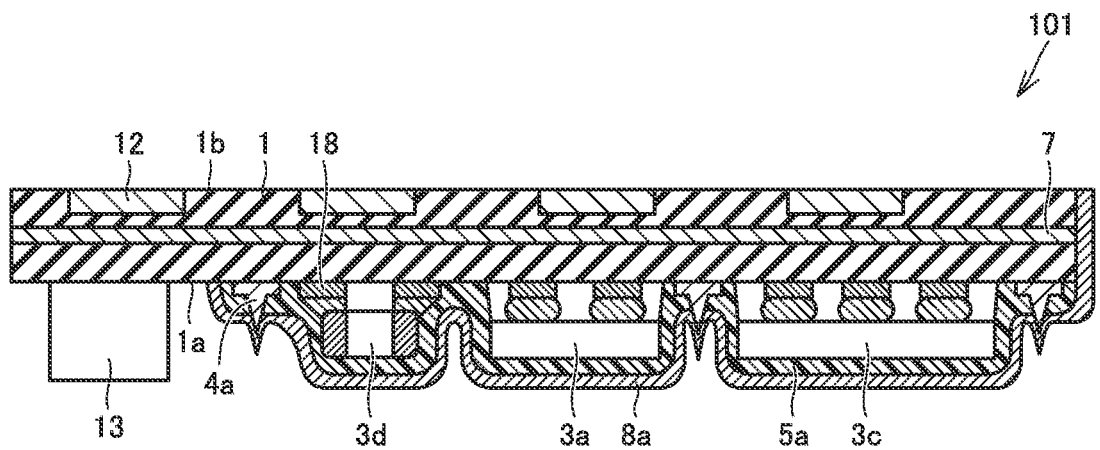
FIG. 1 is a cross-sectional view of a module according to a first embodiment of the present disclosure.

The following describes a module according to the first embodiment of the present disclosure with reference to FIGS. 1 to 4. FIG. 1 is a cross-sectional view of a module 101 according to the present embodiment.

Figure 2:
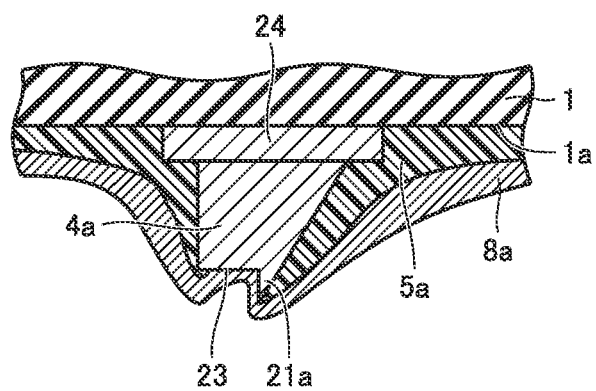
FIG. 2 is a partial view showing, in an enlarged manner, a first protruding electrode and its periphery provided in the module according to the first embodiment of the present disclosure.

Module 101 includes: a substrate 1 having a first surface 1a; a first component 3a mounted on first surface 1a; a first protruding electrode 4a disposed on first surface 1a; a first resin film 5a covering first component 3a along the shape of first component 3a, covering at least a part of first surface 1a, and partially covering first protruding electrode 4a; and a first shield film 8a formed to overlap with first resin film 5a. Substrate 1 has a second surface 1b facing opposite to first surface 1a. FIG. 2 shows an enlarged view of first protruding electrode 4a and its periphery. First protruding electrode 4a includes a first sharpened portion 21a. In at least a part of first sharpened portion 21a, first protruding electrode 4a is exposed from first resin film 5a. First shield film 8a is electrically connected to first protruding electrode 4a by covering a portion where first protruding electrode 4a is exposed from first resin film 5a.

Figure 3:
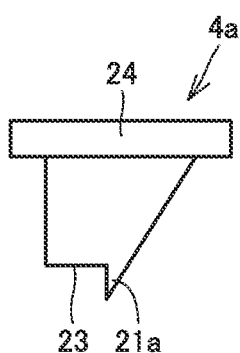
FIG. 3 is a side view of a first protruding electrode provided in the module according to the first embodiment of the present disclosure.
Figure 4:
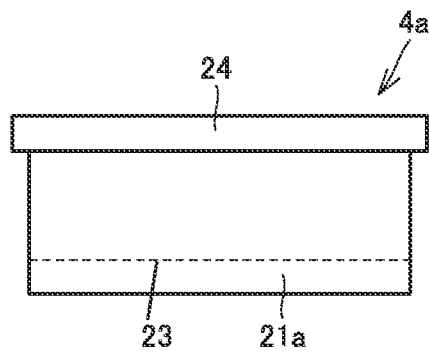
FIG. 4 is a front view of the first protruding electrode provided in the module according to the first embodiment of the present disclosure.

First protruding electrode 4a is grounded by a wiring line (not shown). The wiring line for grounding is disposed on the surface of substrate 1 or disposed inside substrate 1. FIG. 3 shows first protruding electrode 4a in an independent and separate manner. In FIG. 4, first protruding electrode 4a is viewed in a direction different by 90° from that in FIG. 3. First protruding electrode 4a includes a base portion 24. First protruding electrode 4a has a flat portion 23. In the example shown in this case, at least a part of flat portion 23 is also exposed from first resin film 5a as shown in FIG. 2. Also in flat portion 23, first shield film 8a covers first protruding electrode 4a and is electrically connected to first protruding electrode 4a.

An inner-layer ground electrode 7 is disposed inside substrate 1. In addition to first component 3a, components 3c and 3d and a connector 13 are mounted on first surface 1a of substrate 1. Similarly to first component 3a, components 3c and 3d are covered with first resin film 5a and first shield film 8a, but connector 13 is not covered with first resin film 5a and first shield film 8a.

As shown in FIG. 1, first protruding electrode 4a is provided also between first component 3a and component 3c. By providing first protruding electrode 4a between the components in this way, noise interference between the components can be suppressed.

An antenna 12 is disposed on second surface 1b of substrate 1. One of side surfaces of substrate 1 is covered with first shield film 8a. Through this side surface, inner-layer ground electrode 7 and first shield film 8a are electrically connected to each other. The shape, the number, and the arrangement of components 3c, 3d and the like are shown merely by way of example and are not limited to the above example. In the present embodiment, for convenience of description, a component denoted by a symbol "3a" in FIG. 1 is referred to as a "first component", but other components may also be regarded as the first component.

In the present embodiment, as shown in FIG. 2, first sharpened portion 21a is provided in first protruding electrode 4a, and a portion where first sharpened portion 21a is exposed from first resin film 5a is directly covered with first shield film 8a serving as a shield film, and thereby, first shield film 8a and first protruding electrode 4a are electrically connected to each other, so that a ground potential can be stably applied to the shield film. Therefore, stable shielding performance can be achieved in module 101.

As shown in the present embodiment, first protruding electrode 4a preferably has flat portion 23. First protruding electrode 4a configured to have flat portion 23 allows easy vacuum absorption of first protruding electrode 4a with the help of flat portion 23, so that first protruding electrode 4a can be easily handled. In the case where first protruding electrode 4a is fabricated in advance as a metal member and then mounted on first surface 1a of substrate 1, it is conceivable to carry first protruding electrode 4a to a desired position on the surface of substrate 1 while first protruding electrode 4a is held by a vacuum chuck.

As shown in the present embodiment, it is preferable that flat portion 23 is also exposed from first resin film 5a and first shield film 8a is electrically connected to first protruding electrode 4a in flat portion 23. Employing such a configuration can achieve more stable shielding performance.

As shown in the present embodiment, first sharpened portion 21a preferably has a blade shape. First sharpened portion 21a illustrated in FIGS. 3 and 4 has a blade shape that facilitates cutting of first resin film 5a. By cutting first resin film 5a along a certain length by the blade-shaped member, a large contact area between first shield film 8a and first protruding electrode 4a can be ensured.

As shown in the present embodiment, a component mounted on first surface 1a and not covered with first resin film 5a and first shield film 8a, i.e., an exposed component, may be provided. By employing such a configuration, a component to be used while being directly exposed to the outside can be used in this module. For obtaining a configuration having an exposed component in this way, for example, a mask may be in advance placed to cover a region where first resin film 5a and first shield film 8a should not be formed, in which state first resin film 5a and first shield film 8a may be formed, from which the mask may be removed, on which an exposed component may then be mounted.

Further, the exposed component may be a connector or a sensor. The present embodiment shows an example in which the exposed component is connector 13 (see FIG. 1), but some type of sensor may be disposed in place of connector 13. Both the connector and the sensor may be disposed in one module. Connector 13 provided in the same manner as in module 101 facilitates connection to the outside.

As shown in the present embodiment, antenna 12 may be disposed on at least one of first surface 1a and second surface 1b. Employing such a configuration allows wireless communication with the outside using antenna 12. In the example shown in FIG. 1, antenna 12 is disposed on the second surface, but the shape, the size, and the arrangement of antenna 12 shown in this case are merely by way of example, and are not limited to the above example.

In the examples shown in FIGS. 3 and 4, first protruding electrode 4a includes base portion 24, but may not include base portion 24.

(Method of Fabricating Structure around First Protruding Electrode)

Figure 5:
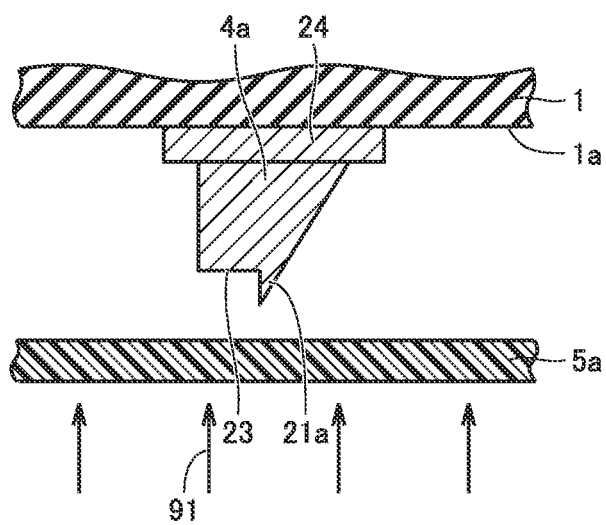
FIG. 5 is an explanatory diagram of a first step of a method of fabricating a periphery of the first protruding electrode of the module according to the first embodiment of the present disclosure.
Figure 6:
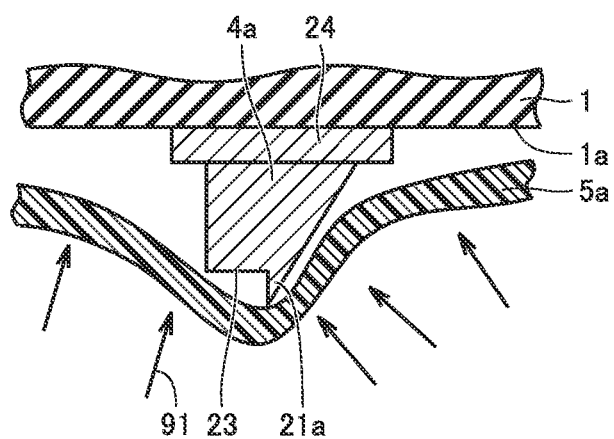
FIG. 6 is an explanatory diagram of a second step of the method of fabricating a periphery of the first protruding electrode of the module according to the first embodiment of the present disclosure.
Figure 7:
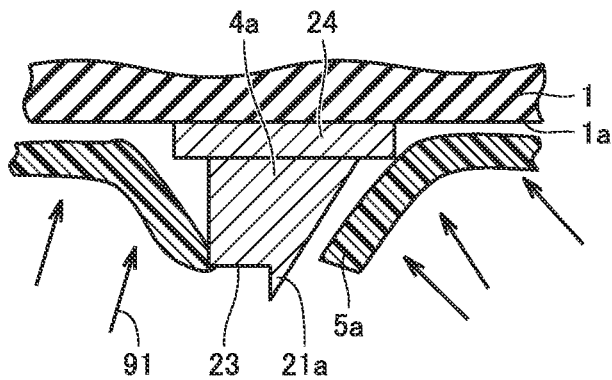
FIG. 7 is an explanatory diagram of a third step of the method of fabricating a periphery of the first protruding electrode of the module according to the first embodiment of the present disclosure.
Figure 8:
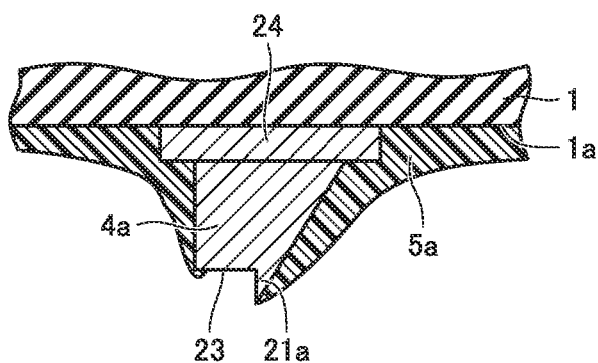
FIG. 8 is an explanatory diagram of a fourth step of the method of fabricating a periphery of the first protruding electrode of the module according to the first embodiment of the present disclosure.

The structure around first protruding electrode 4a in module 101 (see FIG. 2) can be obtained in the following manner. First, as shown in FIG. 5, first protruding electrode 4a is mounted on first surface 1a of substrate 1. Further, as shown in FIG. 5, sheet-shaped first resin film 5a is placed over first protruding electrode 4a and heated while being pressurized as shown by arrows 91. Since first resin film 5a is pressed against first protruding electrode 4a as shown in FIG. 6 in the state in which tensile stress is applied in the plane direction, first resin film 5a is cut by first sharpened portion 21a. Both sides of the cut portion of sheet-shaped first resin film 5a are pulled by the tensile stress away from the tip end of first sharpened portion 21a. This results in the state as shown in FIG. 7 in which first sharpened portion 21a and flat portion 23 are not covered with first resin film 5a. In this state, first resin film 5a is heated and softened. When heating is stopped and the temperature lowers, first resin film 5a hardens and then the state shown in FIG. 8 is obtained. Then, first shield film 8a is further formed. First shield film 8a can be formed, for example, by sputtering. The structure shown in FIG. 2 is obtained in this way.

As to protruding electrodes such as first protruding electrode 4a, a protruding electrode fabricated in advance as a metal member having a desired shape as described above may be introduced and mounted, but may be formed by plating on first surface 1a of substrate 1. These protruding electrodes may be formed by a single plating process or may be formed by repeating a plurality of plating processes. Further, first protruding electrode 4a to be provided in advance as a metal member having a desired shape may be provided as a combination of a plurality of metal materials. First protruding electrode 4a is not necessarily entirely formed of metal, but may be a composite member formed of a combination of a resin member and a metal member.

First protruding electrode 4a formed of a combination of a resin member and a metal member may be prepared in advance as a member having a desired shape, and then, may be introduced and mounted on substrate 1.

Second Embodiment

Figure 9:
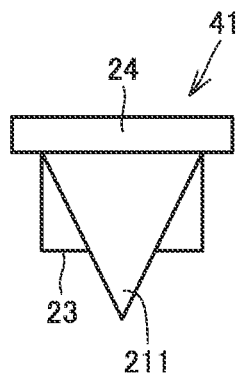
FIG. 9 is a side view of a first protruding electrode provided in a module according to a second embodiment of the present disclosure.
Figure 10:
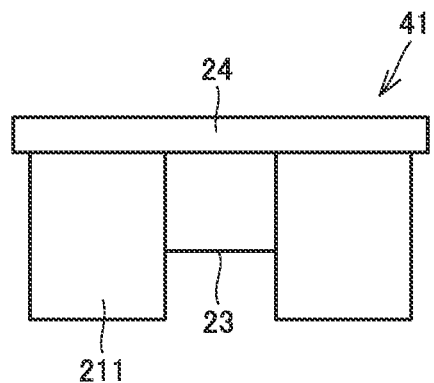
FIG. 10 is a front view of the first protruding electrode provided in the module according to the second embodiment of the present disclosure.

The following describes a module according to the second embodiment of the present disclosure with reference to FIGS. 9 and 10. FIG. 9 is a side view of a protruding electrode 41 used in the module in the present embodiment. Protruding electrode 41 is used as the "first protruding electrode" in place of first protruding electrode 4a illustrated in the first embodiment. Since the configurations of other portions in the module are the same as those shown in the first embodiment, the description thereof will not be repeated. In FIG. 10, protruding electrode 41 shown in FIG. 9 is viewed in the direction different by 90° from that in FIG. 9.

Protruding electrode 41 includes two sharpened portions 211 and one flat portion 23. Sharpened portion 211 has a blade shape. Flat portion 23 is disposed to be sandwiched between two sharpened portions 211. The number and the length of sharpened portion 211 are not limited to the above example. The number of sharpened portions 211 may be one or may be three or more. In the example shown in FIG. 9, sharpened portion 211 has a bilaterally symmetrical shape.

Figure 11:
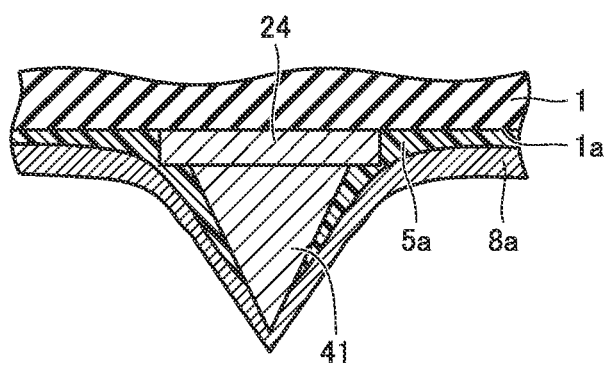
FIG. 11 is a cross-sectional view of the first protruding electrode and its periphery provided in the module according to the second embodiment of the present disclosure.

Also in the present embodiment, the effect as described in the first embodiment can be achieved. First resin film 5a and first shield film 8a adhere to protruding electrode 41 as shown in FIG. 11. Since sharpened portion 211 of protruding electrode 41 has a bilaterally symmetrical shape, the portion where first shield film 8a is in contact with protruding electrode 41 is also substantially bilaterally symmetrical in length. Since protruding electrode 41 is bilaterally symmetrical in shape as shown in FIG. 9, it is advantageous that the front and back surfaces need not be distinguished at the time of assembly operation.

Figure 12:
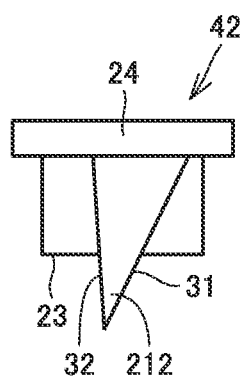
FIG. 12 is a side view of a first protruding electrode provided in a modification of the module according to the second embodiment of the present disclosure.
Figure 13:
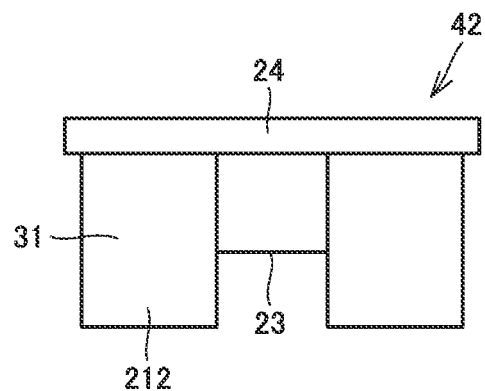
FIG. 13 is a front view of the first protruding electrode provided in the modification of the module according to the second embodiment of the present disclosure.

On the other hand, as a modification of the present embodiment, a protruding electrode 42 shown in FIGS. 12 and 13 may be used in place of protruding electrode 41. In FIG. 13, protruding electrode 42 shown in FIG. 12 is viewed in the direction different by 90° from that in FIG. 12. Protruding electrode 42 includes two sharpened portions 212 and one flat portion 23. Sharpened portion 212 has a blade shape. Flat portion 23 is disposed to be sandwiched between two sharpened portions 212. As shown in FIG. 12, sharpened portion 212 of protruding electrode 42 has a bilaterally asymmetrical shape. Sharpened portion 212 of protruding electrode 42 has a first inclined surface 31 and a second inclined surface 32. In the present example, the blade shape of sharpened portion 212 has a first inclined surface 31 and a second inclined surface 32 that is located on the side opposite to first inclined surface 31 and is steeper than first inclined surface 31.

Figure 14:
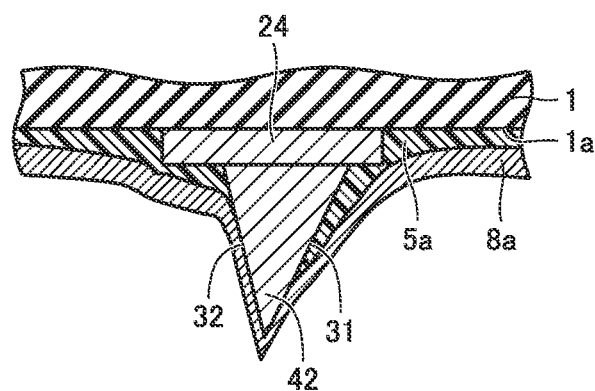
FIG. 14 is a cross-sectional view of the first protruding electrode and its periphery provided in the modification of the module according to the second embodiment of the present disclosure.

In the present example, a portion where first shield film 8a contacts protruding electrode 41 is as shown in FIG. 14. In other words, the portions where first shield film 8a contacts protruding electrode 41 on both sides are asymmetrical in length. Thus, first shield film 8a can be in contact with protruding electrode 41 integrally over a long section along the steep second inclined surface, so that the electrical connection to the shield film can be stabilized.

Third Embodiment

Figure 15:
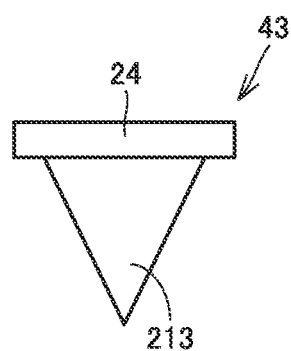
FIG. 15 is a side view of a first protruding electrode provided in a module according to a third embodiment of the present disclosure.
Figure 16:
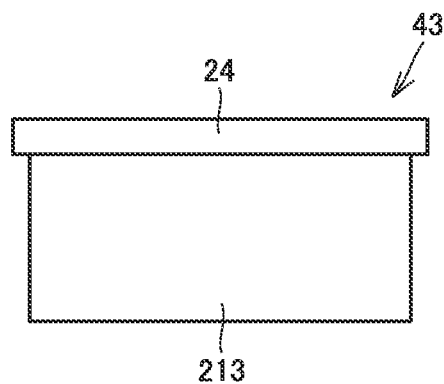
FIG. 16 is a front view of the first protruding electrode provided in the module according to the third embodiment of the present disclosure.

The following describes a module according to the third embodiment of the present disclosure with reference to FIGS. 15 and 16. FIG. 15 is a side view of a protruding electrode 43 used in the module in the present embodiment. Protruding electrode 43 is used as the "first protruding electrode" in place of first protruding electrode 4a shown in the first embodiment. Since the configurations of other portions in the module are the same as those shown in the first embodiment, the description thereof will not be repeated. In FIG. 16, protruding electrode 43 shown in FIG. 15 is viewed in the direction different by 90° from that in FIG. 15.

Protruding electrode 43 shown in this case includes a base portion 24 and a sharpened portion 213. Protruding electrode 43 does not have flat portion 23. Such a configuration may also be adopted.

Also in the present embodiment, the effect as described in the first embodiment can be achieved.

Further, if the protruding electrode is not fabricated in advance as an independent metal member before mounting, but if the protruding electrode is formed on first surface 1*a* of substrate 1 by a method such as plating, a lack of flat portion 23 causes no problem.

Fourth Embodiment

Figure 17:
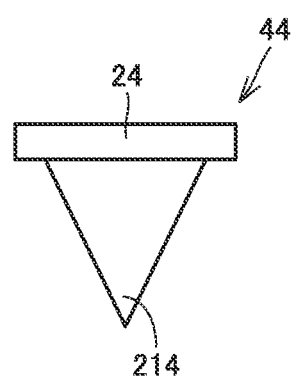
FIG. 17 is a side view of a first protruding electrode provided in a module according to a fourth embodiment of the present disclosure.
Figure 18:
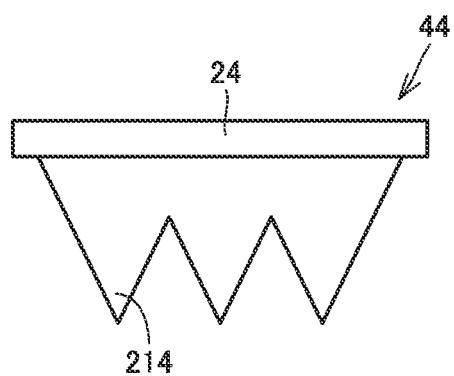
FIG. 18 is a front view of the first protruding electrode provided in the module according to the fourth embodiment of the present disclosure.

The following describes a module according to the fourth embodiment of the present disclosure with reference to FIGS. 17 and 18. FIG. 17 is a side view of a protruding electrode 44 used in the module according to the present embodiment. Protruding electrode 44 is used as the "first protruding electrode" in place of first protruding electrode 4*a* shown in the first embodiment. Since the configurations of other portions in the module are the same as those shown in the first embodiment, the description thereof will not be repeated. In FIG. 18, protruding electrode 44 shown in FIG. 17 is viewed in the direction different by 90° from that in FIG. 17.

Protruding electrode 44 shown in this case includes a base portion 24 and a sharpened portion 214. Sharpened portion 214 of protruding electrode 44 has a conical shape rather than a blade shape. In protruding electrode 44, a plurality of sharpened portions 214 are connected side by side in a line. The shape of each sharpened portion 214 included in protruding electrode 44 may be a conical shape or a pyramid shape.

Also in the present embodiment, the effect as described in the first embodiment can be achieved. Protruding electrode 44 has a conical shape. Thus, one point of the tip end of this protruding electrode 44 is pierced through first resin film 5*a* to provide a hole in first resin film 5*a*, and a portion around this hole is expanded by tensile stress toward the periphery, so that protruding electrode 44 is exposed. Through this exposed portion, protruding electrode 44 and first shield film 8*a* can be electrically connected to each other. Although protruding electrode 44 configured to have a plurality of conical sharpened portions 214 continuously arranged is exemplified in this case, a protruding electrode provided with a single conical sharpened portion 214 may also be used.

Fifth Embodiment

Figure 19:
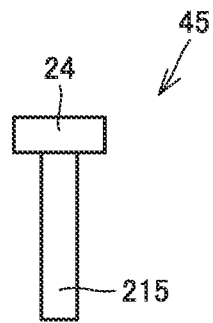
FIG. 19 is a side view of a first protruding electrode provided in a module according to a fifth embodiment of the present disclosure.
Figure 20:
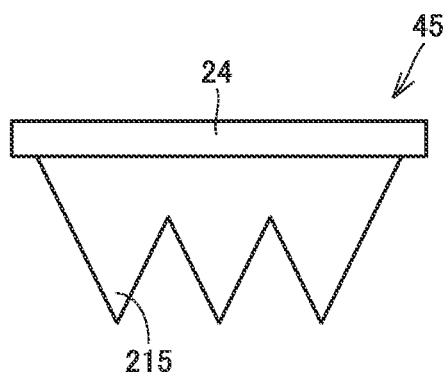
FIG. 20 is a front view of the first protruding electrode provided in the module according to the fifth embodiment of the present disclosure.

The following describes a module according to the fifth embodiment of the present disclosure with reference to FIGS. 19 and 20. FIG. 19 is a side view of a protruding electrode 45 used in the module according to the present embodiment. Protruding electrode 45 is used as the "first protruding electrode" in place of first protruding electrode 4*a* shown in the first embodiment. Since the configurations of other portions in the module are the same as those shown in the first embodiment, the description thereof will not be repeated. In FIG. 20, protruding electrode 45 shown in FIG. 19 is viewed in the direction different by 90° from that in FIG. 19.

Protruding electrode 45 shown in this case includes a base portion 24 and a sharpened portion 215. Sharpened portion 215 of protruding electrode 45 has a flat plate shape. Protruding electrode 45 has a shape like a saw blade. Protruding electrode 45 has a structure in which a plurality of sharpened portions 215 are continuously arranged. In the example shown in FIG. 20, protruding electrode 45 includes a series of three sharpened portions 215 that are continuously arranged, but the number of sharpened portions 215 to be arranged is not limited to three and may be any number other than three.

The effect as described in the first embodiment can be achieved also in the present embodiment.

Sixth Embodiment

Figure 21:
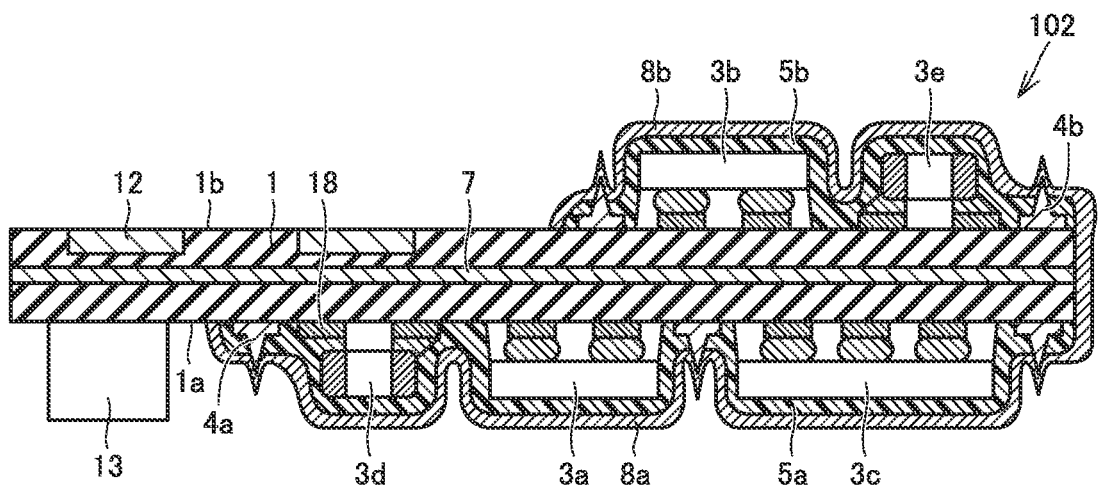
FIG. 21 is a cross-sectional view of a module according to a sixth embodiment of the present disclosure.
Figure 22:
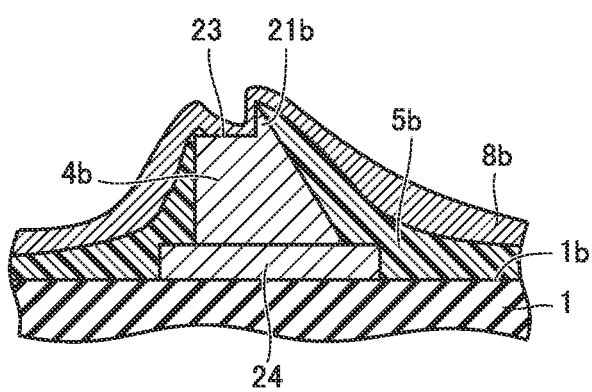
FIG. 22 is a partial view showing, in an enlarged manner, a second protruding electrode and its periphery provided in the module according to the sixth embodiment of the present disclosure.

The following describes a module according to the sixth embodiment of the present disclosure with reference to FIGS. 21 and 22. FIG. 21 is a cross-sectional view of a module 102 in the present embodiment.

Module 102 has the configuration as described in the first embodiment and additionally has the following configuration.

Module 102 has a double-sided mounting structure. In other words, in module 102, substrate 1 has second surface 1*b* facing opposite to first surface 1*a*, and module 102 includes second component 3*b* mounted on second surface 1*b*. More specifically, in module 102, substrate 1 has second surface 1*b* facing opposite to first surface 1*a*, and an antenna 12 is disposed on at least one of first surface 1*a* and second surface 1*b*.

Module 102 includes: a second protruding electrode 4*b* disposed on second surface 1*b*; a second resin film 5*b* covering second component 3*b* along the shape of second component 3*b*, covering at least a part of second surface 1*b*, and partially covering second protruding electrode 4*b*; and a second shield film 8*b* formed to overlap with second resin film 5*b*. FIG. 22 shows an enlarged view of second protruding electrode 4*b* and its periphery. Second protruding electrode 4*b* includes a second sharpened portion 21*b*. In at least a part of second sharpened portion 21*b*, second protruding electrode 4*b* is exposed from second resin film 5*b*. Second shield film 8*b* is electrically connected to second protruding electrode 4*b* by directly covering a portion where second protruding electrode 4*b* is exposed from second resin film 5*b*.

A partial region of second surface 1*b* of substrate 1 is not covered with second resin film 5*b* and second shield film 8*b*. Antenna 12 is disposed in the region where second surface 1*b* is exposed in this way.

As to the detailed shape of second protruding electrode 4*b* and conceivable modifications thereof, the concept as described above about the first protruding electrode in the previous embodiments can be applicable.

Since a double-sided mounting structure is adopted in the present embodiment, a large number of components can be mounted on substrate 1 having a limited area, so that a highly functional module can be achieved. The present embodiment illustrates an example in which protruding electrodes are disposed on both first surface 1*a* and second surface 1*b*, but the protruding electrode may be disposed on only one of the surfaces.

Among the above-described embodiments, a plurality of embodiments may be employed in an appropriate combination.

The above-described embodiments disclosed herein are illustrative in all respects and should not be construed as being restrictive. The scope of the present disclosure is defined by the terms of the claims, and is intended to include any modifications within the meaning and scope equivalent to the terms of the claims.

1 substrate, 1*a* first surface, 1*b* second surface, 3*a* first component, 3*b* second component, 3*c*, 3*d*, 3*e* component, 4*a* first protruding electrode, 4*b* second protruding electrode, 5*a* first resin film, 5*b* second resin film, 7 inner-layer ground electrode, 8*a* first shield film, 8*b* second shield film, 12 antenna, 13 connector, 18 pad electrode, 21*a* first sharpened portion, 21*b* second sharpened portion, 23 flat portion, 24 base portion, 25 first inclined surface, 26 second inclined surface, 31 first inclined surface, 32 second inclined surface, 41, 42, 43, 44, 45 protruding electrode, 91 arrow, 101, 102 module, 211, 212, 213, 214, 215 sharpened portion.

The invention claimed is:

1. A module comprising: a substrate having a first surface; a first component mounted on the first surface; a first protruding electrode disposed on the first surface; a first resin film covering the first component along a shape of the first component, covering at least a part of the first surface, and partially covering the first protruding electrode; and a first shield film provided to overlap with the first resin film, wherein the first protruding electrode includes a first sharpened portion, in at least a part of the first sharpened portion, the first protruding electrode is exposed from the first resin film, and the first shield film is electrically connected to the first protruding electrode by covering a portion of the first protruding electrode exposed from the first resin film; and the first protruding electrode further includes a flat portion extended along the first surface and adjacent to a blade shape; and the flat portion is also exposed from the first resin film, and the first shield film is electrically connected to the first protruding electrode in the flat portion.

2. The module according to claim 1, wherein the blade shape has a first inclined surface and a second inclined surface, the second inclined surface being located on a side opposite to the first inclined surface, the second inclined surface being steeper than the first inclined surface.

3. The module according to claim 1, further comprising an exposed component mounted on the first surface and not covered with the first resin film and the first shield film.

4. The module according to claim 3, wherein the exposed component is a connector or a sensor.

5. The module according to claim 1, wherein
the substrate has a second surface facing opposite to the first surface, and
the module comprises a second component mounted on the second surface.

6. The module according to claim 5, wherein an antenna is disposed on at least one of the first surface and the second surface.

7. The module according to claim 1, wherein the substrate has a second surface facing opposite to the first surface, and an antenna is disposed on at least one of the first surface and the second surface.

8. The module according to claim 5, further comprising:
a second protruding electrode disposed on the second surface;
a second resin film covering the second component along a shape of the second component, covering at least a part of the second surface, and partially covering the second protruding electrode; and
a second shield film provided to overlap with the second resin film, wherein
the second protruding electrode includes a second sharpened portion,
the second protruding electrode is exposed from the second resin film in at least a part of the second sharpened portion, and
the second shield film is electrically connected to the second protruding electrode by covering a portion of the second protruding electrode exposed from the second resin film.

9. The module according to claim 1, further comprising an exposed component mounted on the first surface and not covered with the first resin film and the first shield film.

10. The module according to claim 1, further comprising an exposed component mounted on the first surface and not covered with the first resin film and the first shield film.

11. The module according to claim 1, further comprising an exposed component mounted on the first surface and not covered with the first resin film and the first shield film.

12. The module according to claim 2, further comprising an exposed component mounted on the first surface and not covered with the first resin film and the first shield film.

13. The module according to claim 1, wherein
the substrate has a second surface facing opposite to the first surface, and
the module comprises a second component mounted on the second surface.

14. The module according to claim 1, wherein
the substrate has a second surface facing opposite to the first surface, and
the module comprises a second component mounted on the second surface.

15. The module according to claim 1, wherein
the substrate has a second surface facing opposite to the first surface, and
the module comprises a second component mounted on the second surface.

* * * * *